(12) United States Patent
Jeon et al.

(10) Patent No.: US 8,964,167 B2
(45) Date of Patent: Feb. 24, 2015

(54) CYLINDRICAL MAGNETIC LEVITATION STAGE AND LITHOGRAPHY

(75) Inventors: Jeong Woo Jeon, Gyeongsangnam-do (KR); Hyeon Seok Oh, Gyeonggi-do (KR); Mitica Caraiani, Gyeongsangnam-do (KR); Sung Il Chung, Gyeongsangnam-do (KR); Hyeon Taeg Kim, Gyeongsangnam-do (KR); Chang Rin Lee, Gyeongsangnam-do (KR); Jong Moon Kim, Daegu (KR)

(73) Assignee: Korea Electrotechnology Research Institute, Gyeongsangnam-do (KR)

( * ) Notice: Subject to any disclaimer, the term of this patent is extended or adjusted under 35 U.S.C. 154(b) by 198 days.

(21) Appl. No.: 13/512,477

(22) PCT Filed: Oct. 28, 2010

(86) PCT No.: PCT/KR2010/007464
§ 371 (c)(1),
(2), (4) Date: May 29, 2012

(87) PCT Pub. No.: WO2011/074775
PCT Pub. Date: Jun. 23, 2011

(65) Prior Publication Data
US 2013/0120732 A1    May 16, 2013

(30) Foreign Application Priority Data

Dec. 15, 2009 (KR) .................. 10-2009-0124537

(51) Int. Cl.
*G03F 7/20* (2006.01)
*G03F 7/24* (2006.01)
*H01L 21/68* (2006.01)

(52) U.S. Cl.
CPC .............. *G03F 7/70716* (2013.01); *G03F 7/24* (2013.01); *G03F 7/703* (2013.01);
(Continued)

(58) Field of Classification Search
CPC ........ G03B 27/02; G03B 27/10; G03B 27/12; G03F 7/00; G03F 7/002; G03F 7/0015; G03F 7/0017; G03F 7/12; G03F 7/20; G03F 7/2014; G03F 7/24; G03F 7/70; G03F 7/703; G03F 7/7035; G03F 7/70366; G03F 7/70716; G03F 7/70758; G03F 7/70791; G03F 7/70816; H01L 21/67; H01L 21/68; H02K 2201/15; H02K 2201/18
USPC ....... 310/12.14, 40 R; 355/72, 75, 78, 84, 85, 355/104, 110, 117
See application file for complete search history.

(56) References Cited

U.S. PATENT DOCUMENTS 4,837,443 A * 6/1989 Young et al. ............. 250/440.11
8,354,908 B2 * 1/2013 Jeon et al. ..................... 335/229

(Continued)

FOREIGN PATENT DOCUMENTS

| DE | 102005061028 | * 11/2010 |
|---|---|---|
| JP | 63-177978 | 7/1988 |
| JP | 2002-374664 | 12/2002 |
| JP | 2007-109810 | 4/2007 |
| KR | 10-2008-0049386 A | 6/2008 |
| KR | 1020080049386 A * | 6/2008 |
| WO | WO 2010002071 A3 * | 7/2010 |

*Primary Examiner* — Colin Kreutzer
(74) *Attorney, Agent, or Firm* — Frommer Lawrence & Haug LLP; Ronald R. Santucci

(57) ABSTRACT

The present invention provides a cylindrical magnetic levitation stage and an exposure apparatus, which can form a nanoscale pattern of a large area directly on the surface of a large cylinder. The present invention provides an exposure apparatus including a new type of cylindrical magnetic levitation stage, which can levitate, rotate, and move a cylinder in the axial direction by the principle of magnetic levitation in a non-contact manner and form a nanoscale pattern on the surface of the cylinder, and a light source for irradiating light on the surface of the cylinder, thereby reducing the position error of the cylindrical magnetic levitation stage to a nanoscale size and correcting the error caused by mechanical processing in real time. Moreover, the present invention provides an exposure apparatus, which includes a differential vacuum means combined with the cylindrical magnetic levitation stage to create a partial vacuum environment between the light source and the surface of the cylinder, and thus it is possible to employ light sources such as X-rays, electron beams, extreme ultraviolet (EUV) rays, etc.

10 Claims, 3 Drawing Sheets

(52) U.S. Cl.
CPC ....... *G03F 7/70758* (2013.01); *G03F 7/70725* (2013.01); *G03F 7/70791* (2013.01); *G03F 7/70816* (2013.01); *G03F 7/70825* (2013.01); *G03F 7/70841* (2013.01); *H01L 21/68* (2013.01)
USPC ............. 355/104; 310/12.14; 355/72; 355/84

(56) References Cited

U.S. PATENT DOCUMENTS

2002/0088940 A1  7/2002  Watanabe et al.
2011/0234343 A1* 9/2011  Jeon et al. .................... 335/291

* cited by examiner (a)　　　　　　　　　(b)

CYLINDRICAL MAGNETIC LEVITATION STAGE AND LITHOGRAPHY

This application is a 371 of PCT/KR2010/007464 filed on Oct. 28, 2010 published on Jun. 23, 2011 under publication number WO 2011/074775 A which claims priority benefits to Korean Patent Application Number 10-2009-0124537 filed Dec. 15, 2009, the entire disclosure of which is incorporated herein by reference.

TECHNICAL FIELD

The present invention relates to a cylindrical magnetic levitation stage and an exposure apparatus and, more particularly, to a cylindrical magnetic levitation stage and an exposure apparatus, which can form a nanoscale pattern of a large area directly on the surface of a large cylinder.

BACKGROUND ART

Typically, to form an optical pattern, a micro-pattern mold is fabricated, and the pattern is formed using the micro-pattern mold.

The important factors in the fabrication of the micro-pattern mold include the overall uniformity of the mold, the density of the micro-pattern, the depth of processing, the surface roughness, etc.

Recently, as the size of a cylindrical mold is gradually increased, a means or method for fabricating a large cylindrical mold is required.

Up to now, there is no apparatus for forming a nanoscale pattern directly on the surface of a large cylinder.

In the past, a similar apparatus which can form a micro-pattern on the surface of a cylinder was used.

Examining the techniques applied to this apparatus, a contact type mechanical bearing or a combination of a non-contact type air bearing and a rotary motor was used to rotate the cylinder, and a contact type linear guide or a combination of a non-contact type air guide and a linear motor was used to move the cylinder in the axial direction.

However, in this case, it is difficult to reduce the size of the pattern according to the processing degree of components which constitute the apparatus.

Especially, in the case of light sources such as X-rays, electron beams, and extreme ultraviolet (EUV) rays, a vacuum environment is required, and thus it is difficult to use existing techniques.

As a result, there are some difficulties in reducing the error, which occurs when the cylinder is rotated and moved in the axial direction, to a nanoscale size, and it is difficult to form a nanoscale pattern of a large area directly on the surface of the large cylinder using a light source due to this error.

SUMMARY OF INVENTION

Technical Problem

The present invention has been made in an effort to solve the above-described problems associated with prior art, and an object of the present invention is to provide an exposure apparatus including a new type of cylindrical magnetic levitation stage, which can levitate, rotate, and move a cylinder in the axial direction by the principle of magnetic levitation in a non-contact manner and form a nanoscale pattern on the surface of the cylinder, and a light source for irradiating light on the surface of the cylinder, thereby reducing the position error of the cylindrical magnetic levitation stage to a nanoscale size and correcting the error caused by mechanical processing in real time.

Moreover, the present invention provides an exposure apparatus, which includes a differential vacuum means combined with the cylindrical magnetic levitation stage to create a partial vacuum environment between the light source and the surface of the cylinder, and thus it is possible to employ light sources such as X-rays, electron beams, extreme ultraviolet (EUV) rays, etc.

Solution to Problem

In one aspect, the present invention provides a cylindrical magnetic levitation stage including: a cylinder operating unit for rotation and a cylinder operating unit for linear movement, which support both sides of a cylindrical mold and is rotated and linearly moved by magnetic levitation force and magnetic moving force generated by the interaction between permanent magnets and electromagnets; and a cylinder fixing unit for rotation and a cylinder fixing unit for linear movement, which are disposed at the bottom of the cylinder operating unit for rotation and the cylinder operating unit for linear movement, respectively, to support the cylindrical operating units in a non-contact manner, wherein the cylindrical mold is precisely levitated, rotated and moved in the axial direction in a non-contact manner by magnetic levitation force and magnetic rotational force generated by the interaction between an array of permanent magnets of the cylinder operating unit for rotation and an array of electromagnets of the cylinder fixing unit for rotation and, at the same time, by magnetic levitation force and magnetic moving force generated by the interaction between an array of permanent magnets of the cylinder operating unit for linear movement and the array of electromagnets of the cylinder fixing unit for linear movement.

In another aspect, the present invention provides an exposure apparatus including a cylindrical magnetic levitation stage installed inside a chamber and a light source installed at the top of a cylindrical mold in the chamber and capable of forming a nanoscale pattern of a large area directly on the surface of a large cylinder.

The differential vacuum unit may include a high vacuum line, a low vacuum line, and a pneumatic line, which penetrate the side of the body, extend downward, and are arranged concentrically at the bottom of the body at regular intervals to create a partial vacuum environment between the light source and the cylindrical mold, and thus it is possible to employ light sources such as X-rays, electron beams, extreme ultraviolet (EUV) rays, etc.

Advantageous Effects of Invention

The cylindrical magnetic levitation stage and the exposure apparatus according to the present invention provide the following advantages.

First, it is possible to levitate and rotate the cylinder in a non-contact manner and actively control the position of the exposure apparatus by reducing the error to a nanoscale size, and thus it is possible to correct the error caused by mechanical processing in real time, effectively form a nanoscale pattern of a large area directly on the surface of a large cylinder, and manufacture a high-quality cylindrical mold.

Second, it is possible to create a partial vacuum environment between the light source and the cylindrical mold by a combination of the differential vacuum unit and the cylindrical magnetic levitation stage, and thus it is possible to employ light sources such as X-rays, electron beams, extreme ultraviolet (EUV) rays, etc.

DESCRIPTION OF THE REFERENCE NUMERALS

Figure 1:
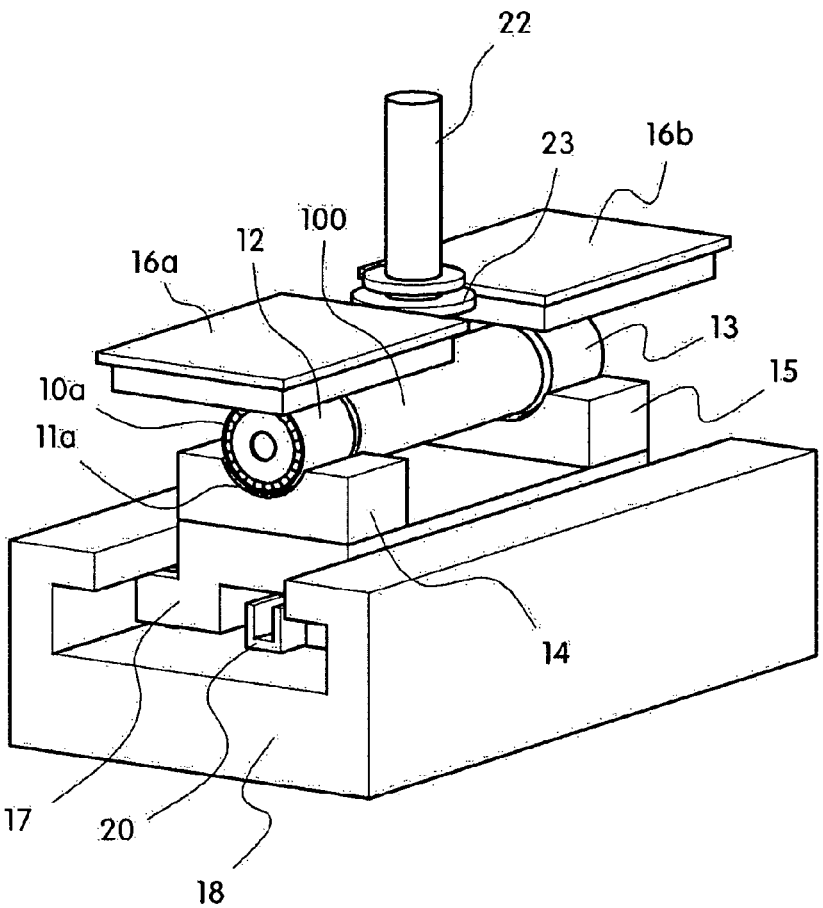
FIG. 1 is a perspective view showing a cylindrical magnetic levitation stage and an exposure apparatus in accordance with one embodiment of the present invention.

10a & 10b: permanent magnets
11a & 11b: electromagnets
12: cylinder operating unit for rotation
13: cylinder operating unit for linear movement
14: cylinder fixing unit for rotation
15: cylinder fixing unit for linear movement
16a & 16b: magnetic levitation force-assist units
17: air levitation operating unit
18: air levitation fixing unit
19: air levitation electromagnet
20: air levitation permanent magnet
21: chamber
22: light source
23: differential vacuum unit
24: high vacuum line
25: low vacuum line
26: pneumatic line
27: air bearing

MODE FOR THE INVENTION

Hereinafter, exemplary embodiments of the present invention will be described in detail. However, the present invention is not limited to the exemplary embodiments disclosed below, but can be implemented in various types. Therefore, the present exemplary embodiments are provided for complete disclosure of the present invention and to fully inform the scope of the present invention to those ordinarily skilled in the art.

Figure 2:
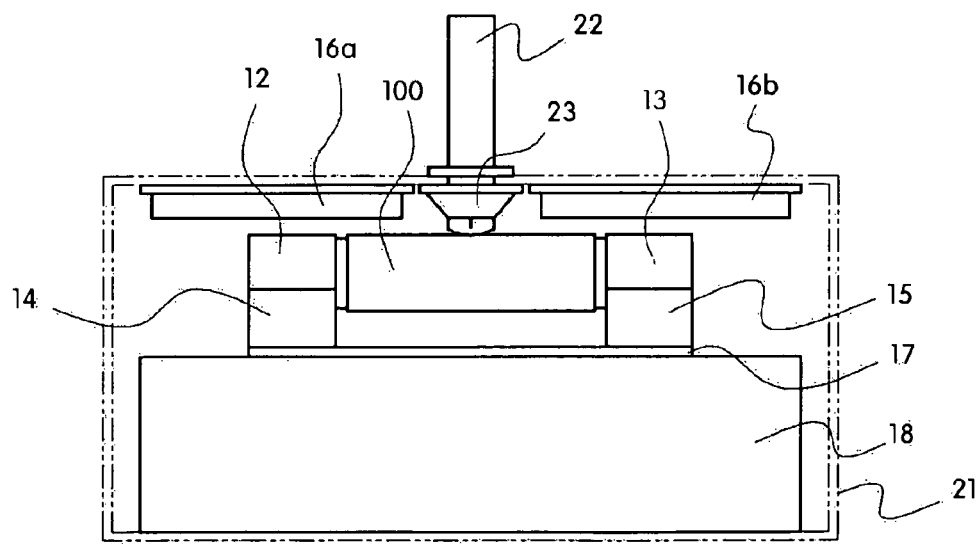
FIG. 2 is a front view showing the cylindrical magnetic levitation stage and the exposure apparatus in accordance with one embodiment of the present invention.
Figure 3:
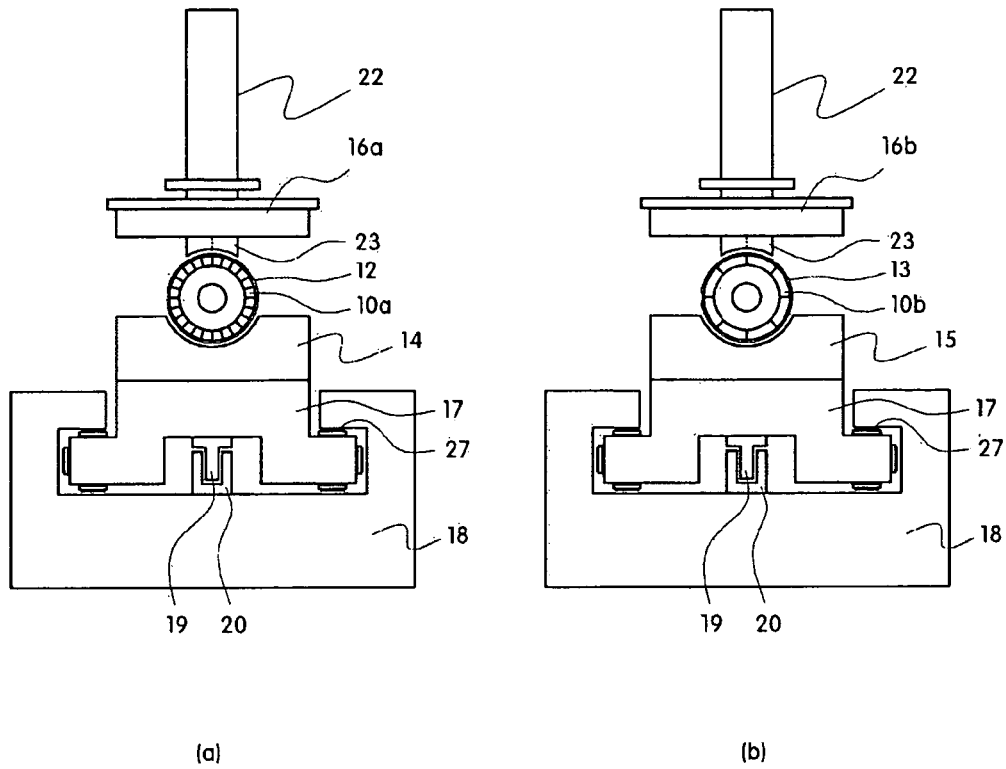
FIG. 3 is a side view showing the cylindrical magnetic levitation stage and an exposure apparatus in accordance with one embodiment of the present invention, in which (a) is a left side view and (b) is a right side view.

FIGS. 1 to 3 are a perspective view, a front view, and a side view showing a cylindrical magnetic levitation stage and an exposure apparatus in accordance with one embodiment of the present invention.

As shown in FIGS. 1 to 3, the exposure apparatus includes a cylindrical magnetic levitation stage, which levitates, rotates, and moves a cylinder in the axial direction by the principle of magnetic levitation in a non-contact manner, an air levitation linear stage for moving the cylindrical magnetic levitation stage in the axial direction of a cylinder, a light source for irradiating light on the surface of the cylinder, and a differential vacuum unit for creating a partial vacuum environment between the light source and the surface of the cylinder.

The cylindrical magnetic levitation stage includes a cylinder operating unit for rotation 12 and a cylinder fixing unit for rotation 14 for levitation and rotation of a cylindrical mold and a cylinder operating unit for linear movement 13 and a cylinder fixing unit for linear movement 15 for levitation and fine linear movement of the cylindrical mold. The cylinder operating units 12 and 13 and the cylinder fixing units 14 and 15 are levitated, rotated, and moved in a non-contact manner by magnetic levitation force, magnetic rotational force, and magnetic moving force generated by the interaction between an array of permanent magnets and an array of electromagnets.

The cylinder operating unit for rotation 12 and the cylinder operating unit for linear movement 13 are disposed at both sides of a cylindrical mold 100 in parallel to each other to hold the cylindrical mold 100. The cylinder operating unit for rotation 12 and the cylinder operating unit for linear movement 13 include permanent magnets 10a and 10b, which are arranged along the circumference of the cylinder operating units 12 and 13, respectively.

Here, the cylindrical mold 100 may be inserted into a hole which penetrates the center of the cylinder operating unit for rotation 12 and that of the cylinder operating unit for linear movement 13, respectively, using both end shafts 110.

The permanent magnets 10a and 10b are installed in such a manner that they are inserted and fixed to the inside of the cylinder operating units 12 and 13 in the axial direction, and thereby it is possible to prevent the array based on the repulsive force between the permanent magnets 10a and 10b from being separated.

The cylinder fixing unit for rotation 14 and the cylinder fixing unit for linear movement 15 support the cylinder operating unit for rotation 12 and the cylinder operating unit for linear movement 13 in a non-contact manner, respectively.

For this purpose, each of the cylinder fixing unit for rotation 14 and the cylinder fixing unit for linear movement 15 has a substantially semicircular arc, in which part of the cylinder operating units 12 and 13 is accommodated.

Here, the cylinder fixing unit for rotation 14 and the cylinder fixing unit for linear movement 15 are installed in such a manner that they are supported by an air levitation operating unit 17 of the air levitation linear stage, which will be described later.

The cylinder fixing unit for rotation 14 and the cylinder fixing unit for linear movement 15 include electromagnets 11a and 11b, respectively, as means for generating the magnetic levitation force by the interaction with the permanent magnets 10a and 10b provided at the cylinder operating units 12 and 13.

The electromagnets 11a and 11b are located on the arcs of the cylinder fixing units 14 and 15 in a predetermined array and fixed thereto by epoxy molding, thereby preventing the array based on the repulsive force between the electromagnets 11a and 11b from being separated.

Figure 4:
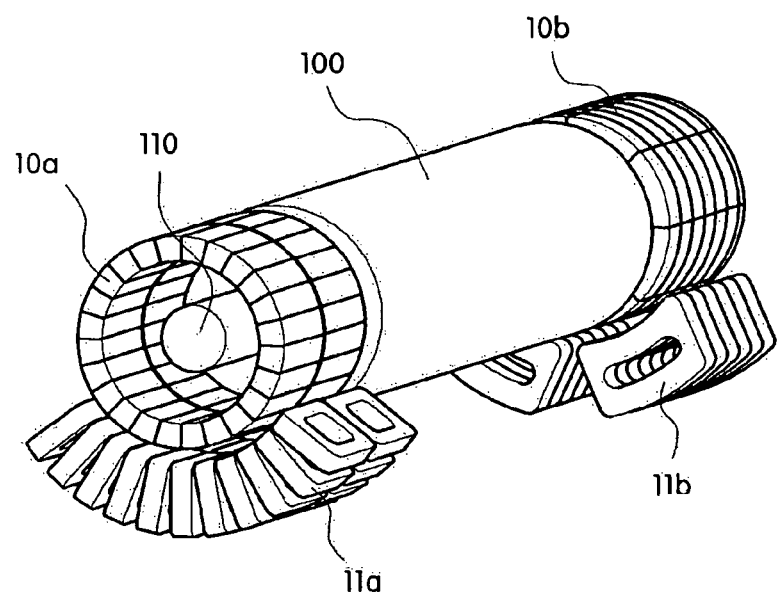
FIG. 4 is a perspective view showing a cylinder operating unit for rotation and a cylinder operating unit for linear movement in the cylindrical magnetic levitation stage and the exposure apparatus in accordance with one embodiment of the present invention.

Therefore, as the permanent magnets 10a and 10b at the cylinder operating units 12 and 13 and the electromagnets 11a and 11b at the cylinder fixing units 14 and 15 form an array as shown in FIG. 4, the magnetic levitation force and the magnetic rotational force are generated at one side and the magnetic levitation force and the magnetic moving force are generated at the other side by the interaction, and thus the cylinder operating unit for rotation 12 and the cylinder operating unit for linear movement 13 as well as the cylindrical mold 100 can be precisely levitated, rotated, and moved in a non-contact manner.

For example, the polarities of the permanent magnets at the cylinder operating units are alternately changed along the circumference of the cylinder.

For the non-contact levitation and rotation of the cylinder operating units, the electromagnets at the cylinder fixing units, which interact with the permanent magnets at the cylinder operating units, are arranged at the cylinder fixing units. When a three-phase current flows through the electromagnets at the cylinder fixing units, a magnetic flux in the form of a sine wave is generated.

This magnetic flux is synchronized with the magnetic flux generated from the permanent magnets at the cylinder operating units to generate a repulsive force.

This repulsive force generates a levitation force in the vertical direction (Z) and a rotational force in the rotational direction (Φ) with respect to the X-axis direction.

Moreover, the cylindrical magnetic levitation stage includes two magnetic levitation force-assist units 16a and 16b as means for assisting the magnetic levitation force.

Each of the magnetic levitation force-assist units 16a and 16b is disposed at the top of the cylinder operating unit for rotation 12 and the cylinder operating unit for linear movement 13 to assist the magnetic levitation force by the interaction between the array of permanent magnets of the cylinder operating unit for rotation 12 and the array of electromagnets of the cylinder fixing unit for rotation 14 and the magnetic levitation force by the interaction between the array of permanent magnets of the cylinder operating unit for linear movement 13 and the array of electromagnets of the cylinder fixing unit for linear movement 15.

Here, the magnetic levitation force-assist units 16a and 16b may be installed in such a manner that they are supported by the top of a chamber 21, which will be described later.

Magnetic suction force is generated between the permanent magnets on the cylinder operating units and the magnetic levitation force assist-units as magnetic substances, and this force provides support to the magnetic levitation force generated between the cylinder operating units and the cylinder fixing units.

In another example of the present invention, the cylindrical mold may be precisely levitated using a cylindrical air bearing in a non-contact manner, instead of the cylindrical magnetic levitation stage, or precisely levitated, rotated and moved in the axial direction using the cylindrical magnetic levitation stage and the cylindrical air bearing together, which makes it possible to reduce the burden in terms of systematic control.

Meanwhile, as a means for moving the entire cylindrical magnetic levitation stage over a long distance in the axial direction, an air levitation linear stage may be provided.

The air levitation linear stage includes an air levitation operating unit 17 and an air levitation fixing unit 18, which are arranged up and down. On the boundary between the air levitation operating unit 17 and the air levitation fixing unit 18, air levitation electromagnets 19 are provided at the air levitation operating unit 17, and air levitation permanent magnets 20 are provided at the air levitation fixing unit 18, the air levitation electromagnets 19 and the air levitation permanent magnets 20 being arranged in parallel to each other along the axial direction.

Thus, as the magnetic moving force is generated by the interaction between the array of the air levitation permanent magnets provided at the air levitation operating unit 17 and the array of the air levitation electromagnets provided at the air levitation fixing unit 18, the air levitation operating unit 17 can be moved in a non-contact manner along the axial direction.

Moreover, a concave-convex structure, in which the air levitation operating unit 17 and the air levitation fixing unit 18 are connected together, is formed on the boundary between the air levitation operating unit 17 and the air levitation fixing unit 18, and air bearings 27 are provided in the connection area, thereby facilitating the linear movement.

In still another example of the present invention, a contact type rolling bearing linear stage may be used as a means for moving the entire cylindrical magnetic levitation stage over a long distance in the axial direction, which provides the advantage that the stage can be formed at low cost.

Here, the air levitation linear stage may be used to move the cylindrical mold over a long distance along the axial direction, and the cylindrical magnetic levitation stage may be used for the rotation and fine movement of the cylindrical mold.

Therefore, the levitation and rotation of the cylindrical mold can be performed by the magnetic levitation force and the magnetic rotational force generated by the interaction between the array of the permanent magnets of the cylinder operating unit for rotation 12 and the array of the electromagnets of the cylinder fixing unit for rotation 14. Moreover, the levitation and fine linear movement of the cylindrical mold can be performed by the magnetic levitation force and the magnetic moving force generated by the interaction between the array of the permanent magnets of the cylinder operating unit for linear movement 13 and the array of the electromagnets of the cylinder fixing unit for linear movement 15. Furthermore, the long distance movement of the cylindrical mold can be performed by the air levitation linear stage composed of a combination of the air levitation operating unit 17 with the array of the air levitation permanent magnets and the air levitation fixing unit 18 with the array of the air levitation electromagnets.

The present invention provides the exposure apparatus employing the above-described cylindrical magnetic levitation stage and the air levitation linear stage.

The cylindrical magnetic levitation stage and the air levitation linear stage are installed in a chamber 21, a light source 22 is installed at the top of the chamber 21, and the magnetic levitation force-assist units 16a and 16b are installed at both sides of the light source 22.

Here, the light source 22 irradiates light on the cylindrical mold to form a pattern and may include X-rays, electron beams, or extreme ultraviolet (EUV) rays.

Moreover, the air levitation fixing unit 18 of the air levitation linear stage may extend to the outside of the chamber 21, and thus the air levitation operating unit 17 can be moved to the outside along the air levitation fixing unit 18.

According to the exposure apparatus of the present invention, it is possible to actively control the position of the exposure apparatus by reducing the error to a nanoscale size by the non-contact rotation and movement of the cylindrical magnetic levitation stage and the air levitation linear stage, and thus it is possible to effectively form a nanoscale pattern of a large area directly on the surface of a large cylinder.

Moreover, the differential vacuum unit 23 for creating a partial vacuum environment may be provided between the light source 22 and the cylindrical mold.

Figure 5:
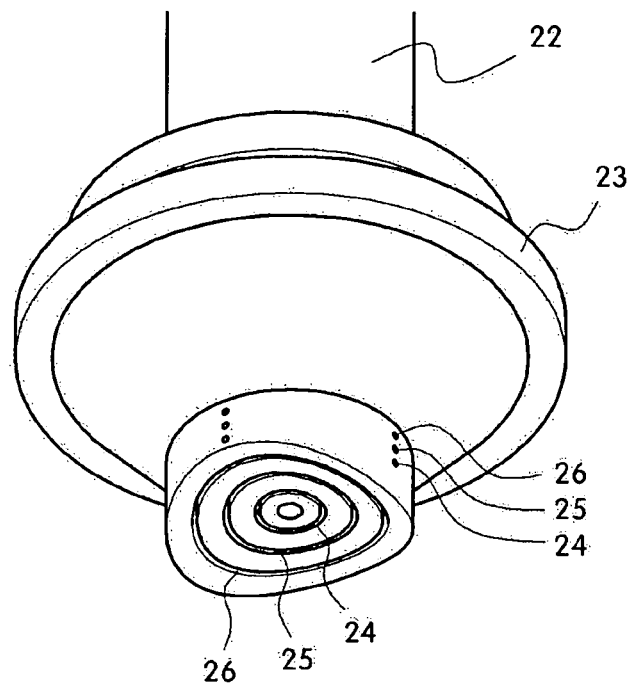
FIG. 5 is a perspective view showing a differential vacuum unit in the cylindrical magnetic levitation stage and the exposure apparatus in accordance with one embodiment of the present invention.
Figure 6:
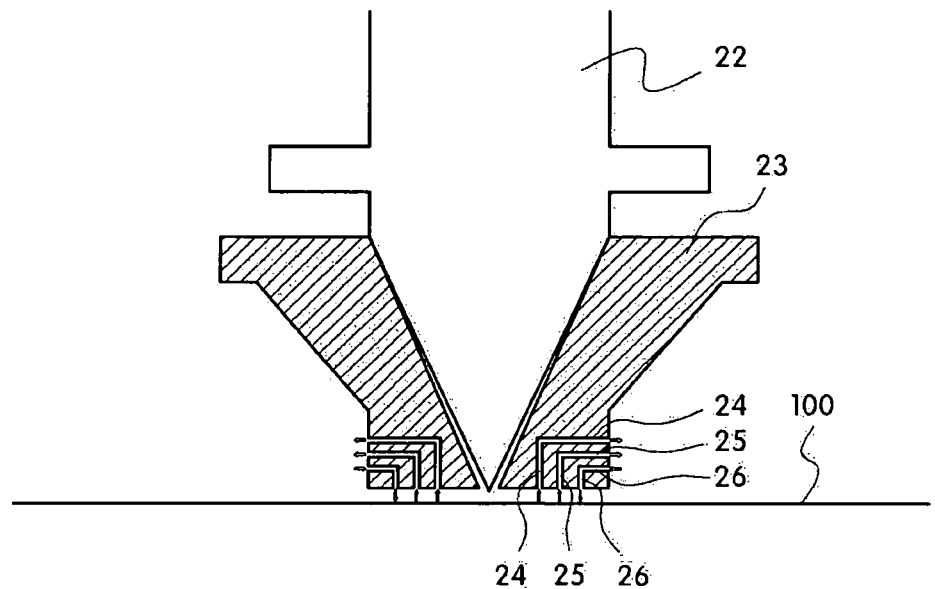
FIG. 6 is a cross-sectional view showing the differential vacuum unit in the cylindrical magnetic levitation stage and the exposure apparatus in accordance with one embodiment of the present invention.

As shown in FIGS. 5 and 6, the differential vacuum unit 23 is installed around the circumference of the light source 22 at the top of the chamber 21, and the bottom of the differential vacuum unit 23, which is in contact with the cylindrical mold 100, has a spherical or non-spherical surface.

The differential vacuum unit 23 includes three conduit lines, which penetrate the side of the body and extend downward, such as a high vacuum line 24, a low vacuum line 25, and a pneumatic line 26, which are arranged concentrically at the bottom of the body at regular intervals.

Here, the differential vacuum unit 23 and the cylindrical magnetic levitation stage can finely control the space between the light source 22 and the cylindrical mold 100.

For example, it is possible to finely control the space, i.e., the distance between the light source 22 and the cylindrical mold 100 by controlling the vacuum pressure of the differential vacuum unit 23 or by controlling the magnetic force of the magnetic levitation stage.

Here, the high vacuum line 24, the low vacuum line 25, and the pneumatic line 26, which are formed on the bottom of the body of the differential vacuum unit 23, may be arranged in various shapes such as a circle, polygon, etc.

Therefore, a predetermined area of the light irradiation region for pattern formation is cut off by pneumatic pressure applied from the outside such that vacuum pressure applied from the outside acts on the inside of the area cut off by the pneumatic pressure, thereby creating a vacuum environment in a predetermined area between the light source and the cylindrical mold.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. An exposure apparatus for forming a nanoscale pattern directly on the surface of a cylinder, the exposure apparatus comprising:
    a cylindrical magnetic levitation stage installed in a chamber;
    a light source installed at the top of a cylindrical mold in the chamber; and
    a differential vacuum unit installed at the top of the cylindrical mold and having a spherical or non-spherical bottom to create a partial vacuum environment between the light source and the cylindrical mold,
    the cylindrical magnetic levitation stage comprising:
    a cylinder operating unit for rotation and a cylinder operating unit for linear movement, which support both sides of a cylindrical mold and is rotated and linearly moved by magnetic levitation force and magnetic moving force generated by the interaction between permanent magnets and electromagnets; and
    a cylinder fixing unit for rotation and a cylinder fixing unit for linear movement, which are disposed at the bottom of the cylinder operating unit for rotation and the cylinder operating unit for linear movement, respectively, to support the cylindrical operating units in a non-contact manner,
    wherein a vacuum pressure of the differential vacuum unit is controlled such that the distance between the light source and the cylindrical mold is finely controllable.

2. The exposure apparatus of claim 1, wherein the permanent magnets are inserted and fixed to the inside of the cylinder operating unit for rotation and the cylinder operating unit for linear movement to prevent the array based on the repulsive force between the permanent magnets from being separated.

3. The exposure apparatus of claim 1, wherein the electromagnets are inserted into the inside of the cylinder fixing unit for rotation and the cylinder fixing unit for linear movement and fixed thereto by epoxy molding to prevent the array based on the repulsive force between the electromagnets from being separated.

4. The exposure apparatus of claim 1, the cylindrical magnetic levitation stage further comprising magnetic levitation force-assist units located adjacent to the top of the cylinder operating unit for rotation and the cylinder operating unit for linear movement to assist the magnetic levitation force by the interaction between the array of permanent magnets and the array of electromagnets.

5. The exposure apparatus of claim 1, the magnetic levitation stage further comprising an air levitation operating unit, which supports the cylinder fixing unit for rotation and the cylinder fixing unit for linear movement, and an air levitation fixing unit, which is disposed at the bottom of the air levitation operating unit, such that the air levitation operating unit is levitated by air levitation electromagnets provided at the air levitation operating unit and air levitation permanent magnets provided at the air levitation fixing unit to move the air levitation operating unit together with the cylinder fixing unit for rotation and the cylinder fixing unit for linear movement in a non-contact manner.

6. The exposure apparatus of claim 5, wherein the long-distance movement of the cylindrical mold in the axial direction is made by the air levitation operating unit and the air levitation fixing unit, and the fine movement of the cylindrical mold in the axial direction is made by the cylinder operating unit for linear movement and the cylinder fixing unit for linear movement.

7. The exposure apparatus of claim 5, wherein the air levitation fixing unit, along which the air levitation operating unit moves, extends to the outside of the chamber such that cylinder operating units and cylinder fixing units as well as the cylindrical mold are moved to the outside of the chamber.

8. The exposure apparatus of claim 1, wherein the differential vacuum unit comprises a high vacuum line, a low vacuum line, and a pneumatic line, which penetrate the side of a body of the differential vacuum unit, extend downward, and are arranged concentrically at the bottom of the body at regular intervals to create a partial vacuum environment between the light source and the cylindrical mold.

9. The exposure apparatus of claim 8, wherein each of the high vacuum line, the low vacuum line, and the pneumatic line, which are formed on the bottom of the body of the differential vacuum unit, has a circular or polygonal shape.

10. The exposure apparatus of claim 1, wherein the cylinder fixing unit for rotation and the cylinder fixing unit for linear movement are moved together by a rolling bearing linear stage.

* * * * *